United States Patent [19]
Terada et al.

[11] Patent Number: 5,981,375
[45] Date of Patent: *Nov. 9, 1999

[54] METHOD OF MANUFACTURING A SEMICONDUCTOR DEVICE

[75] Inventors: Nobuhiro Terada; Michitaka Tominaga, both of Tokyo, Japan

[73] Assignee: Oki Electric Industry Co., Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/890,987

[22] Filed: Jul. 10, 1997

[30] Foreign Application Priority Data

Jul. 11, 1996 [JP] Japan ................................. 8-182410

[51] Int. Cl.$^6$ .................... H01L 21/283; H01L 21/473
[52] U.S. Cl. ...................... 438/624; 438/622; 438/763; 438/787
[58] Field of Search ....................... 438/622, 790, 438/763, 624, 761, 778, 787, 792; 148/DIG. 118

[56] References Cited

U.S. PATENT DOCUMENTS

| | | | |
|---|---|---|---|
| 5,271,972 | 12/1993 | Kwok et al. | 427/579 |
| 5,330,935 | 7/1994 | Dobuzinsky et al. | 148/DIG. 118 |
| 5,356,722 | 10/1994 | Nguyen et al. | 427/762 |
| 5,376,590 | 12/1994 | Machida et al. | 438/763 |
| 5,389,581 | 2/1995 | Freiberger et al. | 438/622 |
| 5,459,108 | 10/1995 | Doi et al. | 148/DIG. 118 |
| 5,502,006 | 3/1996 | Kasagi | 438/624 |
| 5,554,570 | 9/1996 | Maeda et al. | 438/763 |
| 5,563,104 | 10/1996 | Jang et al. | 438/763 |
| 5,605,867 | 2/1997 | Sato et al. | 438/790 |
| 5,607,880 | 3/1997 | Suzuki et al. | 438/624 |

FOREIGN PATENT DOCUMENTS

| | | |
|---|---|---|
| 60-148125 | 8/1985 | Japan . |
| 3-280539 | 12/1991 | Japan . |
| 5-259155 | 10/1993 | Japan . |

*Primary Examiner*—Brian Dutton
*Assistant Examiner*—Maria Guerrero
*Attorney, Agent, or Firm*—Jones Volentine, LLP

[57] ABSTRACT

A method of manufacturing a semiconductor device includes forming an interconnection layer patterned to predetermined shapes on a semiconductor base, forming a plasma TEOS film as a first insulating layer on the surface of the interconnection layer while reducing radio frequency (RF) power, and forming an ozone TEOS film as a second insulating layer on the first insulating layer.

11 Claims, 4 Drawing Sheets

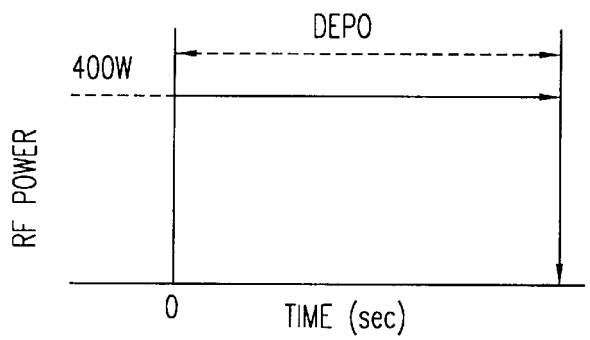
FIG. 3
PRIOR ART
| Concentration Of $O_3$ | $100g/m^3$ (Ozone Content Of 5%) |
|---|---|
| TEMP | 390° C ~ 400° C |
| TEOS (Containing $N_2$ Of Carrier Gas) | 1,5 e/min |
FIG. 4
PRIOR ART
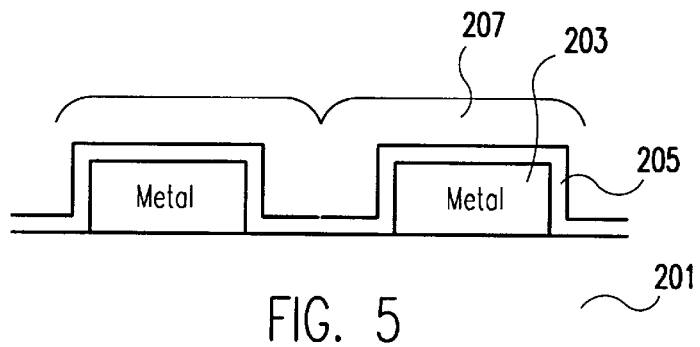
FIG. 5
PRIOR ART

METHOD OF MANUFACTURING A SEMICONDUCTOR DEVICE

BACKGROUND OF THE INVENTION

1. Field of the Invention

This invention relates to a method of manufacturing a semiconductor device, and particularly to a method of forming interlayer insulators or inter-metal layers.

2. Description of the Related Art

A semiconductor device using two types of TEOS (tetra ethyl ortho silicate) layers or films as interlayer insulators has heretofore been known. This type of semiconductor device has been formed in accordance with a processing flow shown in FIG. 2, for example.

A metal material such as aluminum or the like is deposited on a semiconductor base 201 (this semiconductor base may be a semiconductor substrate itself or one including a semiconductor substrate and several films or layers formed on the semiconductor substrate). Thereafter, the metal material is patterned to predetermined configurations or shapes by photolithography to thereby form metal traces or interconnections 203. The width between the adjacent metal interconnections 203 is about 1.4 μm.

A P-TEOS film (plasma TEOS film) 205 corresponding to a lower interlayer insulator is next formed to a thickness of about 2000 Å by a CVD method using plasma excitation. A condition for forming the P-TEOS film is represented as shown in FIG. 3. Namely, RF power for exciting plasma is a predetermined value (400W in the present example) during a period from the beginning of formation of the P-TEOS film to the completion of its formation (for about 17 seconds).

An $O_3$TEOS (ozone TEOS film) 207 corresponding to an upper interlayer insulator is formed on the P-TEOS film 205 in about 8000 Å by an atmospheric-pressure CVD method.

A condition for forming the $O_3$TEOS film 207 is represented as shown in FIG. 4.

However, in the above-described method, the shape of the interlayer insulator between the adjacent metal interconnections 203 becomes steep (large in steplike offset or difference in level and steep in gradient) as illustrated in an enlarged cross-sectional view of FIG. 5. As a result, the coverage of the upper metal interconnection formed on the interlayer insulator becomes worse. Further, since an unnecessary metal interconnection material is easy to remain at each steplike-offset portion (on the interlayer insulator located between the metal interconnections 203) upon the patterning process for forming the upper metal interconnection, its improvement has been desired.

SUMMARY OF THE INVENTION

With the foregoing in view, it is therefore an object of the present invention to provide a flatter interlayer insulator.

It is another object of the present invention to improve the coverage of interconnections formed on an interlayer insulator.

It is a further object of the present invention to prevent an unnecessary interconnection material from remaining at a steplike-offset portion.

According to one aspect of the present invention, for achieving the above objects, there is provided a method of manufacturing a semiconductor device, comprising the steps of:

forming an interconnection layer patterned to a predetermined shape, on a semiconductor base;

forming a first insulating layer on the semiconductor base including an upper portion of the interconnection layer while RF power is reduced; and forming a second insulating layer on the first insulating layer.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 3 is a view illustrating a condition for forming a conventional P-TEOS film;

FIG. 4 is a view showing a condition for forming an $O_3$TEOS film;

FIG. 5 is an enlarged cross-sectional view of the semiconductor device manufactured by the conventional manufacturing method shown in FIG. 2;

DETAILED DESCRIPTION OF THE PREFERRED EMBODIMENTS

Figure 6:
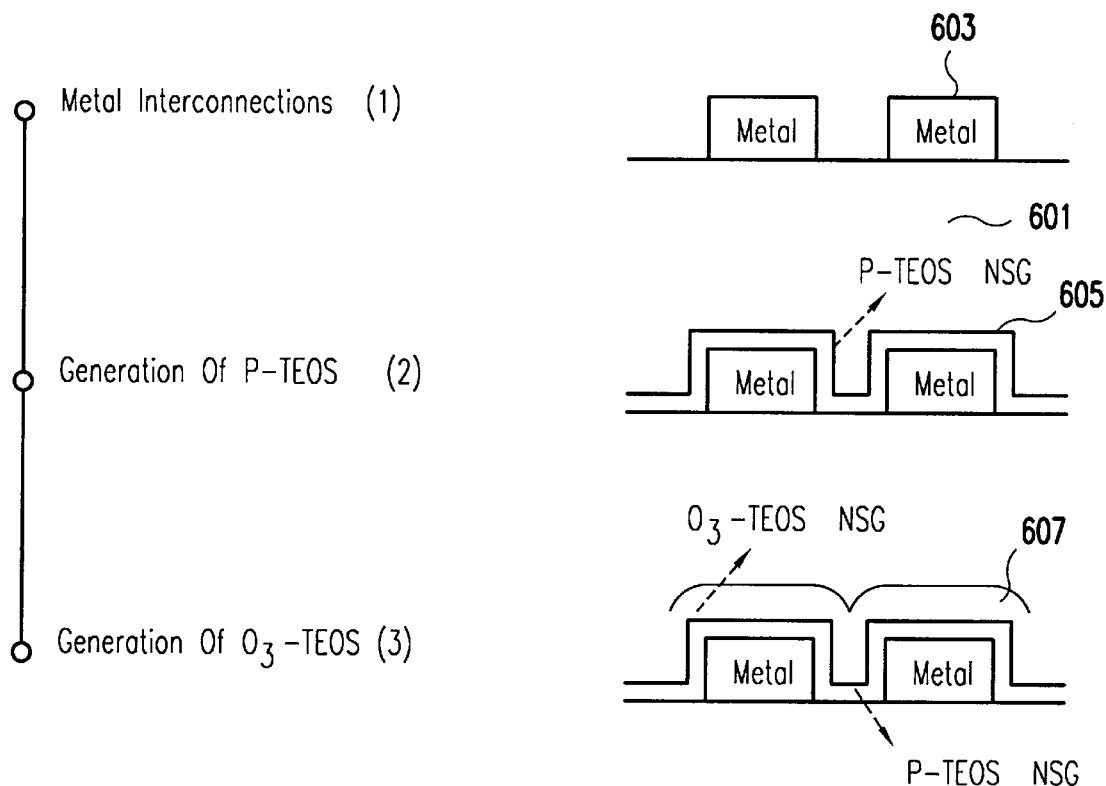
FIG. 6 is a view for describing a method of manufacturing a semiconductor device, according to the present invention.

A preferred embodiment of the present invention will hereinafter be described with reference to FIG. 6.

A metal material such as aluminum or the like is deposited on a semiconductor base 601 (this semiconductor base may be a semiconductor substrate itself or one including a semiconductor substrate and several films or layers formed on the semiconductor substrate. As an example, the semiconductor base 601 includes a semiconductor substrate and a BPSG film provided at an upper portion of the semiconductor substrate). Thereafter, the metal material is patterned to predetermined configurations or shapes by photolithography to thereby form metal traces or interconnections 603. The width between the adjacent metal interconnections 603 is about 1.4 μm.

Figure 1:
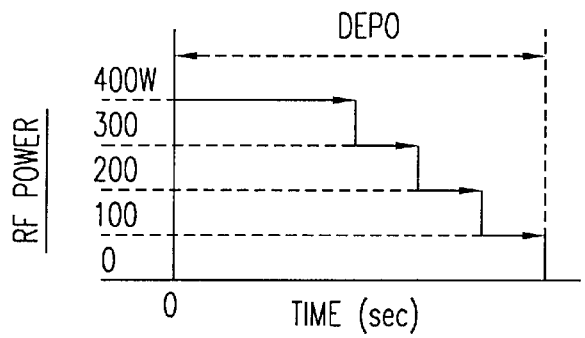
FIG. 1 is a view showing a condition for forming a P-TEOS film employed in the present invention.
Figure 2:
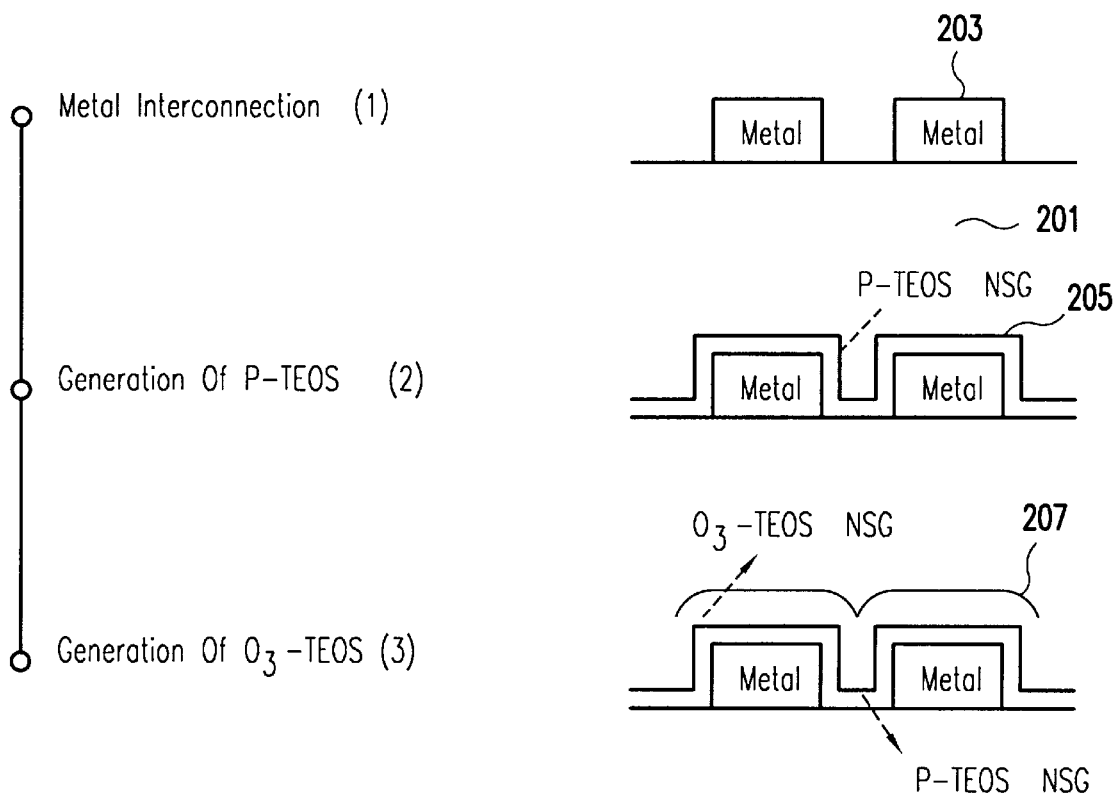
FIG. 2 is a view for describing a method of manufacturing a conventional semiconductor device.

Next, the semiconductor base 601 is placed within an unillustrated plasma CVD chamber. A material gas for generating or producing a TEOS film is then introduced into the chamber. Thereafter, RF power is applied to the semiconductor base 601 in accordance with a condition shown in FIG. 1 to excite plasma. As a result, a CVD method using the plasma excitation is performed so that a P-TEOS film (plasma TEOS film) 605 corresponding to a lower interlayer insulator or inter-metal layer is formed to a thickness of about 2000 Å. The condition shown in FIG. 1 is that the RF power for the plasma excitation is reduced in stages (or stepwise or discontinuously) during a period from the beginning of the formation of the P-TEOS film 605 to the completion of its formation. Described specifically, as shown in FIG. 1, the RF power is varied as 400W (for about 8 seconds) at the early stage of its formation and thereafter the RF power is varied in stages (or stepwise or discontinuously) in order of 300W (about 3 seconds), 200W (3 seconds), 100W (3 seconds) and 0W. Thus, the period during which the RF power is reduced in stages (or stepwise or discontinuously), will hereinafter be called a "rampdown period".

Thus, when the P-TEOS film 605 is formed while the formation condition (RF power) is changed, a surface layer portion of the P-TEOS film 605 is improved in its film material, so that such a film material results in increasing a formation rate (deposition rate) of an $O_3$TEOS (ozone TEOS film) film 607 to be formed in the next process is obtained. Namely, the film material of the surface layer portion of the P-TEOS film 605 results in such a film material as to smooth the shape of each steplike offset of the $O_3$TEOS film 607.

Subsequently, the semiconductor base is shifted to an atmospheric-pressure CVD device to introduce a material gas for generating the $O_3$TEOS film (ozone TEOS film) 607 onto the semiconductor base. As a result, an $O_3$TEOS film (ozone TEOS film) 607 corresponding to an upper interlayer insulator is formed on the P-TEOS film 605 by the atmospheric-pressure CVD method. A condition for forming the $O_3$TEOS film 607 at this time is represented as shown in FIG. 4.

Figure 7:
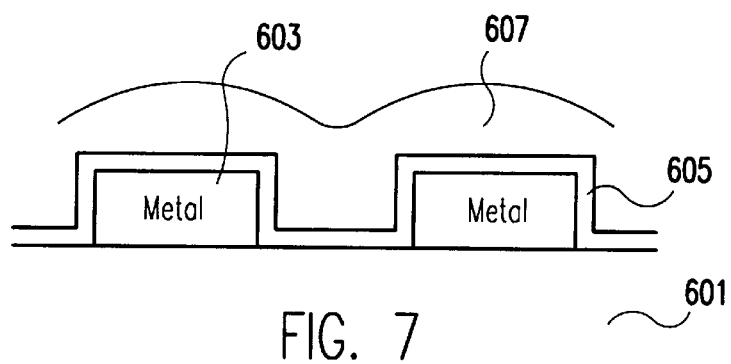
FIG. 7 is an enlarged cross-sectional view of the semiconductor device manufactured by the manufacturing method according to the present invention.

At this time, the formation rate of the $O_3$TEOS film 607 becomes greater than ever due to the influence of the P-TEOS film 605. The formation of the interlayer insulator is finished in accordance with the above-described process. An enlarged cross-sectional view at this time is shown in FIG. 7.

Incidentally, the thickness of the P-TEOS film is not so changed even if the RF rampdown period is provided (the thickness thereof is about 2000 Å in the present embodiment). Thus, according to the present invention, the thickness of the interlayer insulator can be increased without a variation in the thickness of the P-TEOS film.

The evaluation of the formed interlayer insulator will next be described.

Figure 8:
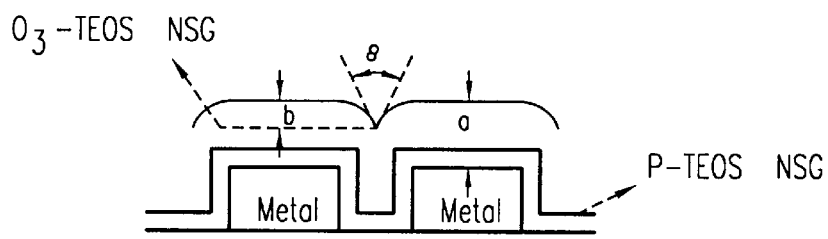
FIG. 8 is a view for explaining parameters for evaluating the shape of an interlayer insulator.

FIG. 8 is a view for explaining parameters for evaluating the shape of the interlayer insulator. Referring to FIG. 8, θ indicates a steplike-offset angle of the interlayer insulator, a indicates the thickness of the interlayer insulator, and b indicates a difference in level or steplike offset. Incidentally, the thickness a of the interlayer insulator includes a thickness of about 2000 Å of the P-TEOS film.

When the conventional method is used, the steplike-offset angle θ, the thickness a of the interlayer insulator and the steplike offset b were about 78 degrees, about 1.02 μm and about 0.85 μm respectively. According to the present invention on the other hand, the steplike-offset angle θ, the thickness a of the interlayer insulator and the steplike offset b were about 129 degrees, about 1.35 μm and about 0.42 μm respectively.

Thus, the interlayer insulator formed using the present invention is reduced in the steplike offset and increased in the steplike-offset angle. Namely, it is apparent that when the present invention is used, the shape of the interlayer insulator is gentler than ever. This is apparent even from the enlarged cross-sectional view shown in FIG. 7.

The relationship between the time required to apply RF power during the rampdown period and the shape of the interlayer insulator will next be explained with reference to FIGS. 9 and 10.

Figure 9:
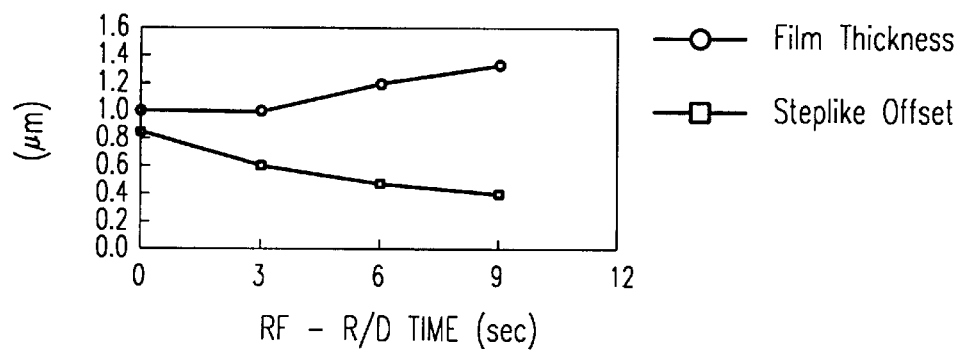
FIG. 9 is a view showing the relationship between the time required to apply RF power during a rampdown period and the shape of the interlayer insulator.

FIG. 9 is a view showing the relationship between the thickness a of the interlayer insulator, the steplike offset b and the time required to apply each RF power during the rampdown period. The time required to apply the RF power during the rampdown period, e.g., a time interval of 9 seconds means that a RF power of 400W, a RF power of 300W, a RF power of 200W and a RF power of 100W are applied for 8 seconds, 3 seconds, 3 seconds and 3 seconds respectively (the sum of the times required to apply 300W, 200W and 100W equals 9 seconds). Similarly, a time interval of 6 seconds means that the RF powers of 400W, 300W, 200W and 100W are applied for 11 seconds, 2 seconds, 2 seconds and 2 seconds respectively (the sum of the times required to apply 300W, 200W and 100W equals 6 seconds).

Figure 10:
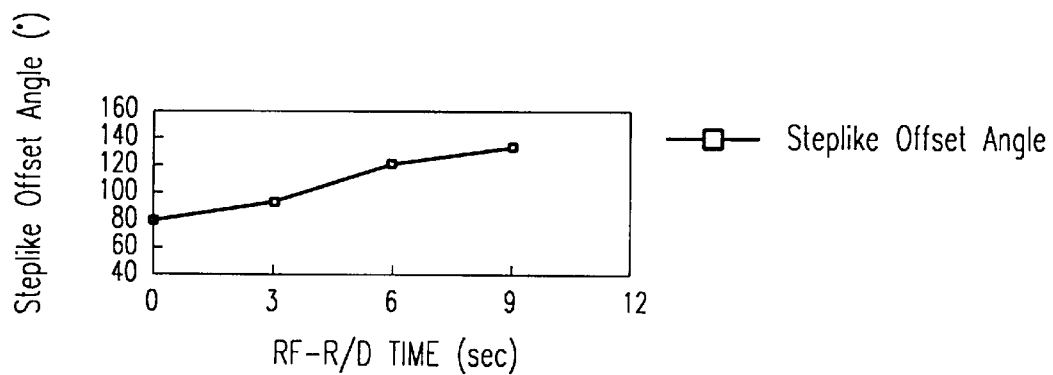
FIG. 10 is a view illustrating the relationship between a steplike-offset angle and the time required to apply RF power during a rampdown period.

FIG. 10 is a view showing the relationship between the steplike-offset angle θ and the time required to apply the RF power during the rampdown period.

When the RF power application time is 0 second, i.e., the same method as previous is used, the steplike offset b is about 0.86 μm, the thickness a of the interlayer insulator is about 1.02 μm and the steplike-offset angle θ is about 78 degrees.

When the time required to apply the RF power during the rampdown period is 3 seconds, the steplike offset b is about 0.58 μm, the thickness a of the interlayer insulator is about 1.03 μm and the steplike-offset angle θ is about 91 degrees.

When the time required to apply the RF power during the rampdown period is 6 seconds, the steplike offset b is about 0.52 μm, the thickness a of the interlayer insulator is about 1.24 m and the steplike-offset angle θ is about 120 degrees.

When the time required to apply the RF power during the rampdown period is 9 seconds, the steplike offset b is about 0.42 μm, the thickness a of the interlayer insulator is about 1.35 μm and the steplike-offset angle θ is about 129 degrees.

It is understood from the above results that as the RF power is reduced in stages (or stepwise or discontinuously) and the RF power application time increases, the steplike offset b is reduced, and the steplike-offset angle θ and the thickness a of the interlayer insulator increase respectively. This means that the use of the present invention makes it possible to obtain the interlayer insulator whose shape is gentle. As a result, it can be expected that the coverage of the upper metal interconnection formed on the interlayer insulator is improved. Further, an unnecessary metal interconnection material can be expected to be prevented from remaining at each steplike offset (on the interlayer insulator located between the adjacent metal interconnections 603) upon the patterning process for forming the upper metal interconnection.

The above-described embodiment has described the case in which the RF power is reduced in stages (or stepwise or discontinuously). However, the present invention may be applied to an embodiment in which the RF power is gradually reduced, i.e., linearly (or continuously) reduced.

According to the typical one of the present invention, as has been described above in detail, the following advantageous effects can be brought about.

Namely, according to the present invention, since the first insulating layer is formed while the formation condition is varied (RF power is reduced), the state of formation of the second insulating layer on the first insulating layer subsequent to the formation of the first insulating layer is improved. Thus, the shape of the interlayer insulator (corresponding to each of the first and second insulating layers) becomes gentle, so that the coverage of the upper metal interconnection formed on the interlayer insulator is improved. Further, the unnecessary metal interconnection material can be prevented from remaining at each steplike-offset portion upon the patterning process for forming the upper metal interconnection.

While the present invention has been described with reference to the illustrative embodiment, this description is not intended to be construed in a limiting sense. Various modifications of the illustrative embodiment will be apparent to those skilled in the art on reference to this description. It is therefore contemplated that the appended claims will cover any such modifications or embodiments as fall within the true scope of the invention.

What is claimed is:

1. A method of manufacturing a semiconductor device, comprising:

forming an interconnection layer patterned to predetermined shapes on a semiconductor base;

forming a plasma TEOS film as a first insulating layer on the semiconductor base including a surface of the interconnection layer while reducing RF power from an initial RF power, a period of said reducing being at least as long as half of a period of application of the initial RF power; and forming an ozone TEOS film as a second insulating layer on the first insulating layer, said forming said second insulating layer including creating said second insulating layer having an offset angle in a predetermined space between adjacent predetermined shapes separated by less than a width of at least one of the adjacent predetermined shapes of greater than 90 degrees.

2. A method according to claim 1, wherein said forming the first insulating layer is executed so as to form the first insulating layer while the RF power is stepwise reduced.

3. A method according to claim 1, wherein said forming the first insulating layer is executed so as to form the first insulating layer while the RF power is gradually reduced.

4. A method according to claim 1, wherein said forming the first insulating layer is executed so as to form the first insulating layer while the RF power is linearly reduced.

5. A method of manufacturing a semiconductor device, comprising:

forming an interconnection layer patterned to predetermined shapes on a semiconductor base;

introducing the semiconductor base into a plasma chamber;

introducing a gas serving as a material for a plasma TEOS film as a first insulating layer into the plasma chamber;

applying RF power to the inside of the plasma chamber and thereafter forming the first insulating layer on the semiconductor base including upper portions of the interconnection layer while reducing the RF power from an initial RF power, a period of said reducing being at least as long as half of a period for the applying of the initial RF power; and forming an ozone TEOS film as a second insulating layer on the first insulating layer, said forming said second insulating layer including creating said second insulating layer having an offset angle in a predetermined space between adjacent predetermined shapes separated by less than a width of at least one of the adjacent predetermined shapes of greater than 90 degrees.

6. A method according to claim 5, wherein said forming the first insulating layer is executed so as to form the first insulating layer while the RF power is stepwise reduced.

7. A method according to claim 5, wherein said forming the first insulating layer is executed so as to form the first insulating layer while the RF power is gradually reduced.

8. A method according to claim 5, wherein said forming the first insulating layer is executed so as to form the first insulating layer while the RF power is linearly reduced.

9. A method of manufacturing a semiconductor device, comprising:

forming an interconnection layer patterned to predetermined shapes on a semiconductor base;

introducing the semiconductor base into a plasma chamber;

introducing a gas serving as a material for a plasma TEOS film as a first insulating layer into the plasma chamber;

applying RF power having a first value to the inside of the plasma chamber, thereafter applying RF power having a second value smaller than the first value to the inside thereof and forming the first insulating layer on the semiconductor base including upper portions of the interconnection layer, a period of said applying of RF power of the second value or less being at least as long as half of a period for the applying of RF power of the first value; and forming an ozone TEOS film as a second insulating layer on the first insulating layer, said forming said second insulating layer including creating said second insulating layer having an offset angle in a predetermined space between adjacent predetermined shapes separated by less than a width of at least one of the adjacent predetermined shapes of greater than 90 degrees.

10. A method according to claim 9, wherein the first and second values are discontinuous therebetween.

11. A method according to claim 9, wherein the first and second values are continuous therebetween.

* * * * *